United States Patent [19]

Shimizu

[11] Patent Number: 4,849,901
[45] Date of Patent: Jul. 18, 1989

[54] SUBSTRATE EXPOSURE APPARATUS WITH FLATNESS DETECTION AND ALARM

[75] Inventor: Hisayuki Shimizu, Yokohama, Japan
[73] Assignee: Nikon Corporation, Tokyo, Japan
[21] Appl. No.: 166,745
[22] Filed: Mar. 2, 1988

Related U.S. Application Data

[63] Continuation of Ser. No. 871,481, Jun. 6, 1986, abandoned.

[30] Foreign Application Priority Data

Jun. 14, 1985 [JP] Japan .................... 60-129343

[51] Int. Cl.$^4$ .................... G06F 15/606; G21K 5/00
[52] U.S. Cl. .................... 364/468; 250/491.1; 250/492.2; 356/400; 364/490; 364/559
[58] Field of Search .................... 364/468, 488–491, 364/559; 250/491.1, 492.1, 492.2, 442.1, 441.1, 201; 356/399, 400, 401; 378/34

[56] References Cited

U.S. PATENT DOCUMENTS

| | | | |
|---|---|---|---|
| 4,251,160 | 2/1981 | Bouwhuis et al. | 356/401 |
| 4,475,223 | 10/1984 | Taniguchi et al. | 378/34 |
| 4,528,451 | 7/1985 | Petric et al. | 250/492.2 X |
| 4,584,479 | 4/1986 | Lamattina et al. | 250/492.2 X |
| 4,615,621 | 10/1986 | Allen et al. | 356/400 X |

FOREIGN PATENT DOCUMENTS 42205 1/1981 Japan .

Primary Examiner—Joseph Ruggiero
Attorney, Agent, or Firm—Shapiro and Shapiro

[57] ABSTRACT

An exposure apparatus has a moving member which can two-dimensionally move a photosensitive substrate in a direction of a reference plane, which is substantially parallel to or coincides with a predetermined image surface on which an original image is to be formed. Information associated with a distance between the surface of the photosensitive substrate and the reference plane is sequentially detected for each of a plurality of regions on the photosensitive substrate to be exposed, and a flatness of the surface of an exposed region of interest with respect to the predetermined image surface is then detected in accordance with information associated with a distance of the exposed region of interest and information associated with the distances of a plurality of exposed regions surrounding the exposed region of interest among a plurality of detected distance data.

9 Claims, 6 Drawing Sheets

FIG. 6A
FIG. 6B
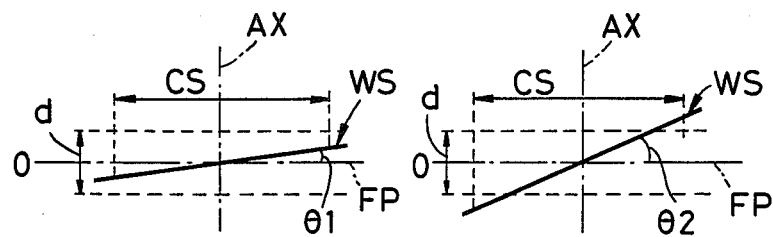
FIG. 7
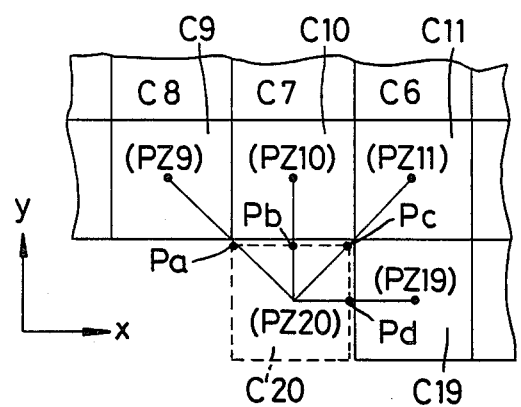

SUBSTRATE EXPOSURE APPARATUS WITH FLATNESS DETECTION AND ALARM

This is a continuation application of Ser. No. 871,481 filed June 6, 1986, now abandoned.

BACKGROUND OF THE INVENTION

1. Field of the Invention

The present invention relates to an exposure apparatus for repetitively exposing a predetermined original image (circuit pattern image, and the like) onto a plurality of regions of a photosensitive layer coated on a semiconductor wafer or a glass substrate for preparing a photomask.

2. Related Background Art

In manufacture of semiconductor elements (more specifically, VLSIs and the like), a pattern on an original (e.g., a reticle or a photomask) is optically exposed onto a wafer as a photosensitive substrate. An exposure apparatus according to the present invention adopts a so-called step-and-repeat method (to be referred to as an SR method hereinafter) wherein, in order to two-dimensionally align a plurality of circuit patterns (also called chips) on the entire surface of the wafer, the wafer is repetitively exposed while it is two-dimensionally stepped with respect to the projected circuit pattern image. In projection lens performance, a minimum line width of a pattern (so-called resolution) to be projected on a wafer is very important. However, as the resolution is increased, the focal depth of the projection lens is decreased accordingly, and a line width of only several micrometers is often obtained. This means that if a deviation of the wafer surface (the photosensitive layer) to be exposed on a given stage from the focal plane of the projection lens falls outside those several micrometers, a predetermined resolution cannot be obtained in the entire area for each shot.

A wafer to be exposed inevitably has some kind of surface deformation. The wafer becomes warped by repetitive exposure, development, and wafer processing (i.e., diffusion, etching, and the like) steps, and has poor flatness. When a wafer is placed on a wafer chuck of the exposure apparatus and is drawn by vacuum suction, the wafer deformation as described above can be corrected to a certain extent, but the wafer cannot be flattened perfectly. During the operation of the exposure apparatus, a photoresist coated on the wafer is removed in the form of a powder, and when another wafer is placed on the wafer chuck, the resist powder is sandwiched between the wafer and the wafer chuck and locally impairs the flatness of the wafer surface.

The poor resolution caused by warping of the wafer surface often occurs not only with a projection type exposure apparatus, but with a proximity type X-ray stepper. In the X-ray stepper, exposure is performed while a mask and a wafer are separated by a given distance (e.g., 10 to 50 micrometers). For this reason, the irregular distance between the mask and the wafer causes the poor resolution.

SUMMARY OF THE INVENTION

It is an object of the present invention to provide an exposure apparatus, adopting an SR method, which can detect whether or not a small region on a photosensitive substrate to be exposed is parallel to a predetermined image surface on which an original image is formed, i.e., a surface flatness for each shot, with a simple arrangement.

According to the present invention, in an exposure apparatus having a moving member which can two-dimensionally move a photosensitive substrate in a direction of a reference plane, which is substantially parallel to or coincides with a predetermined image surface on which an original image is to be formed, information associated with a distance between the surface of the photosensitive substrate and the reference plane is sequentially detected for each of a plurality of regions on the photosensitive substrate to be exposed, and a flatness of the surface of an exposed region of interest with respect to the predetermined surface is then detected in accordance with information associated with a distance of the exposed region of interest and information associated with the distances of a plurality of exposed regions surrounding the exposed region of interest among a plurality of detected distance data.

BRIEF DESCRIPTION OF THE DRAWINGS

FIGS. 6A and 6B are diagrams for explaining a flatness; and

FIG. 7 is a plan view showing chip arrangement for explaining an operation for detecting the flatness.

DETAILED DESCRIPTION OF THE PREFERRED EMBODIMENT

Figure 1:
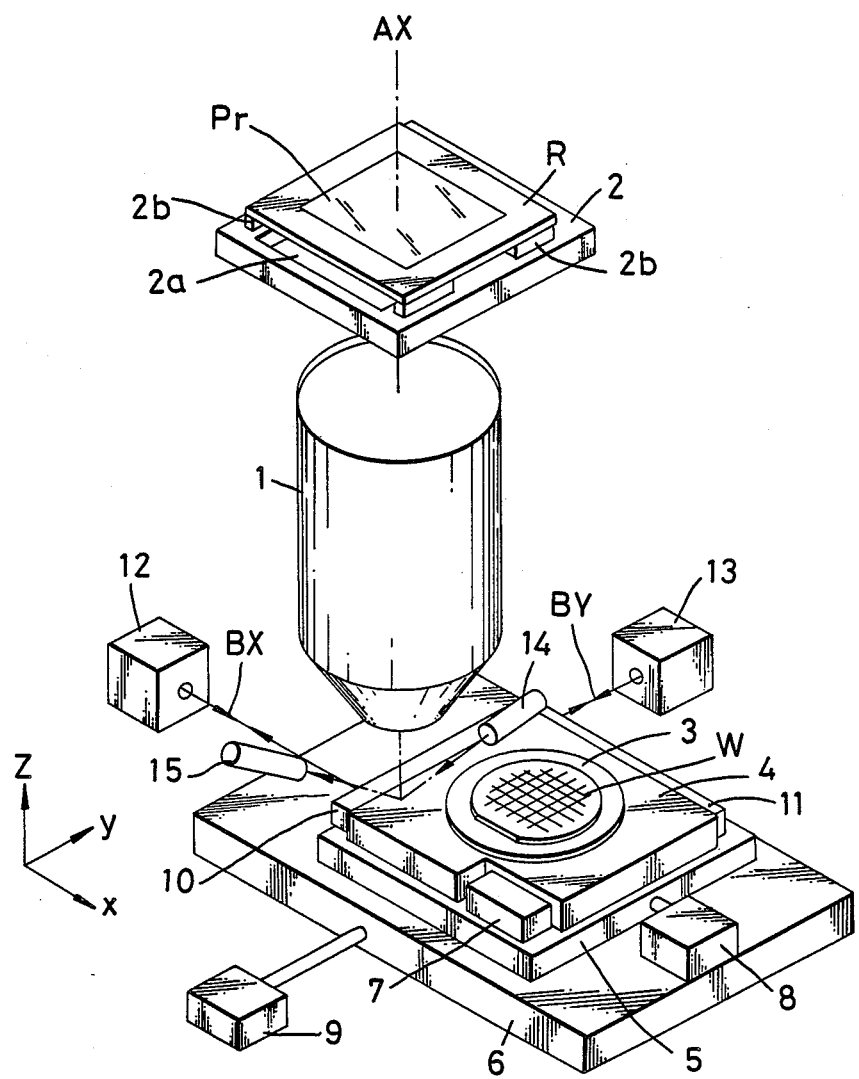
FIG. 1 is a perspective view schematically showing a projection type exposure apparatus according to an embodiment of the present invention.

Referring to FIG. 1, a reduction projection lens 1 reduces and projects an image of reticle R, having a pattern region Pr on which an original pattern (e.g., a circuit pattern) is drawn, onto a wafer W. The reticle R is placed on a reticle holder 2 having vacuum suction sections 2b at its four corners. The reticle holder 2 has an opening 2a corresponding to the pattern region Pr, with which the reticle R can be aligned so that the center thereof (i.e., reticle center) passes through an optical axis AX of the projection lens 1. The wafer W is placed on a wafer holder 3 parallel to the focal plane of the projection lens 1, and is chucked by vacuum suction. The wafer holder 3 is mounted on a Z stage 4 which is vertically movable along the direction of the optical axis AX. The Z stage 4 is mounted on an X stage 5, which is linearly movable in the x direction, and the X stage 5 is mounted on a Y stage 6, which is linearly movable in the y direction perpendicular to the x direction. The wafer W is two dimensionally moved in the x-y plane by means of the X and Y stages 5 and 6, and is moved vertically by the Z stage 4 to adjust a focal point. The Z stage 4 is vertically moved by a dirver 7 provided on the X stage 5, the X stage is moved by a driver 8 provided on the Y stage 6, and the Y stage is moved by a driver 9. Movable mirrors 10 and 11 are mounted on the two orthogonal sides of the Z stage 4. A parallel laser beam BX emitted from a laser interferometer 12 in the x direction is vertically incident on the reflection surface of the movable mirror 10 extending along the y direction, and a parallel laser beam BY emitted from a laser interferometer 13 in the y direction is incident on the reflection surface of the movable mirror 11 extending along the x direction. The laser interferometers 12 and 13 measure a two-dimensional coordinate position on the wafer W. A focal-point detection system of oblique light incident type detects the position in the z direction (the optical axis AX) on the surface of the wafer W when the wafer W is located within the projection region of the projection lens 1. The focal-point detection system comprises a projector 14 for obliquely projecting a focused light beam onto the surface of the wafer W, and a light receiving device 15 which receives the light reflected by the wafer surface and photoelectrically converts it to output a focal-point signal corresponding to the surface level of the wafer W or a deviation of the wafer W from the imaging surface of the projection lens 1. This detection system is equivalent to that disclosed in Japanese Patent Disclosure No. 42205/1981. In this embodiment, although a photoelectric focal-point detection system is adopted, a known focal-point detection system of air micrometer type, which injects air of a given pressure and detects a back pressure of the air, can be adopted.

With the arrangement shown in FIG. 1, the focal plane of the projection lens 1 is a predetermined image surface on which an original image is to be formed, and the X and Y stages 5 and 6 constitute a moving member for two-dimensionally moving the wafer W, as a photosensitive substrate, along a reference plane (in this embodiment, the x-y plane).

Figure 2:
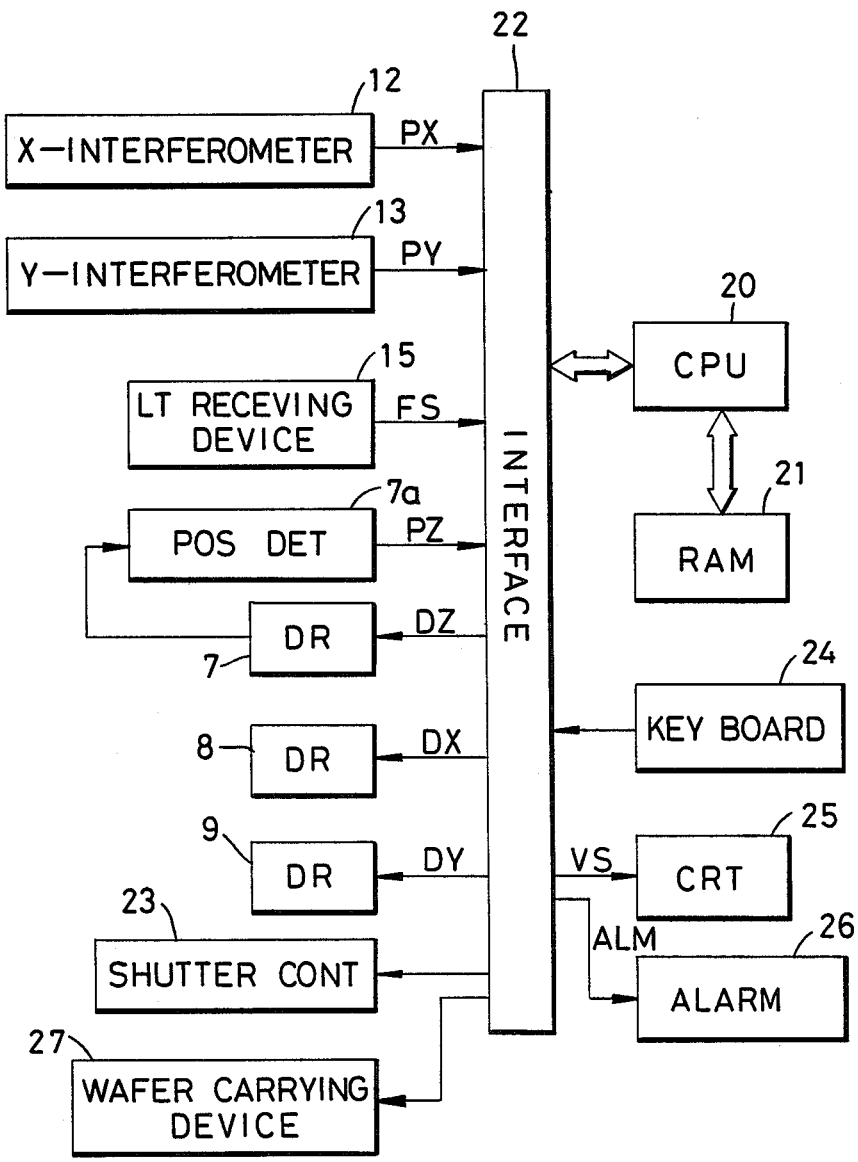
FIG. 2 is a block diagram of a control system of the apparatus shown in FIG. 1.

The same reference numerals in a control system shown in FIG. 2 denote the same parts as in FIG. 1. Control of the entire apparatus and various arithmetic operations are processed by a processor (to be referred to as a CPU hereinafter) 20 (e.g., a microcomputer or a mini-computer) connected to a memory (to be referred to as a RAM hereinafter) 21 for storing various programs and data. The CPU 20 loads, through an input/output interface (to be referred to as an IFC hereinafter) 22, x-direction position information PX on the wafer W detected by the laser interferometer 12, y-direction position information PY on the wafer W detected by the laser interferometer 13, and a focal point signal FS from the light receiving device 15. The drive signals for the respective stages output from the CPU 20 are supplied to the corresponding drivers through the IFC 22. More specifically, a Z drive signal DZ is supplied to the driver 7 for vertically moving the Z stage 4 for focusing, and an X drive signal DX and a Y drive signal DY are supplied to the drivers 8 and 9, respectively. The driver 7 incorporates a Z position detector 7a for generating a signal PZ corresponding to a vertical position of the Z stage 4. If the driver 7 is a motor and its amount of rotation corresponds to only an amount of vertical movement of the Z stage 4, the Z position detector 7a comprises a rotary encoder or a pulse generator for detecting the amount of rotation of the motor. In addition, since illumination control of the reticle R is performed by a shutter, the CPU 20 supplies a control signal to a shutter controlling device 23 for controlling an open/close operation of the shutter during exposure. A wafer carrying device 27 carries the wafer W from a wafer cassette to the wafer holder 3, and vice versa. A keyboard 24 for externally controlling the conditions or operating sequence of the apparatus is provided, and an operator inputs necessary information to the apparatus using the keyboard 24. A display (e.g., a CRT monitor) 25 displays the conditions of the apparatus discriminated by the CPU 20, in accordance with display data VS from the IFC 22.

The display data VS includes data or alarm data associated with the flatness of the surface of the wafer W with respect to the focal plane of the projection lens 1. An alarm 26 solely displays alarm data associated with poor resolution, and receives an alarm signal ALM from the CPU 20 through the IFC 22. The alarm 26 changes its display state (e.g., sound or light) in accordance with the content of the alarm signal ALM, thus notifying the operator. Note that the content of the alarm signal ALM is also included in the display data VS, and is displayed on the display 25.

Figure 3A:
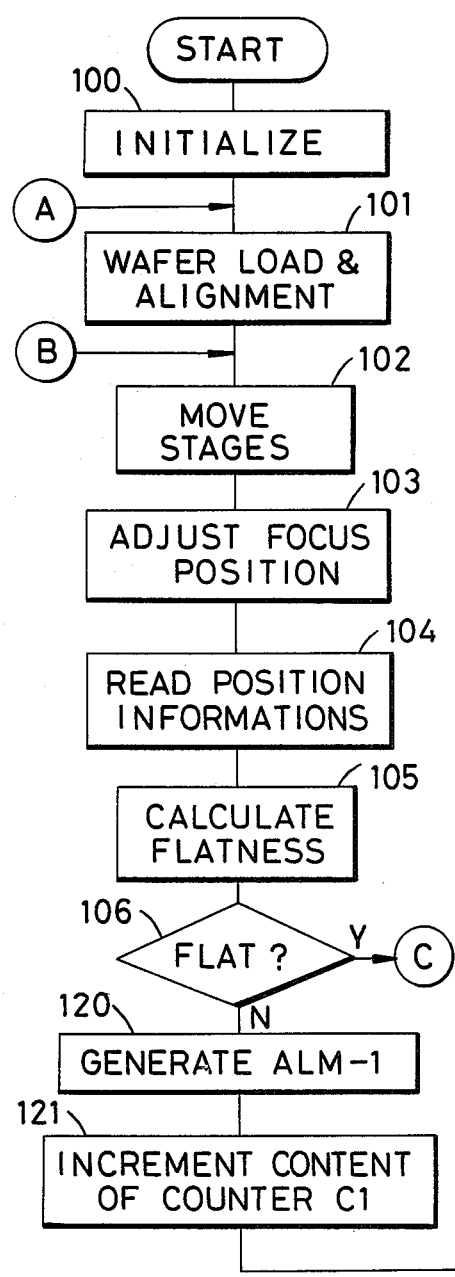
FIGS. 3A and 3B are flow charts showing an exposure operation and an alarm generation operation.
Figure 3A:
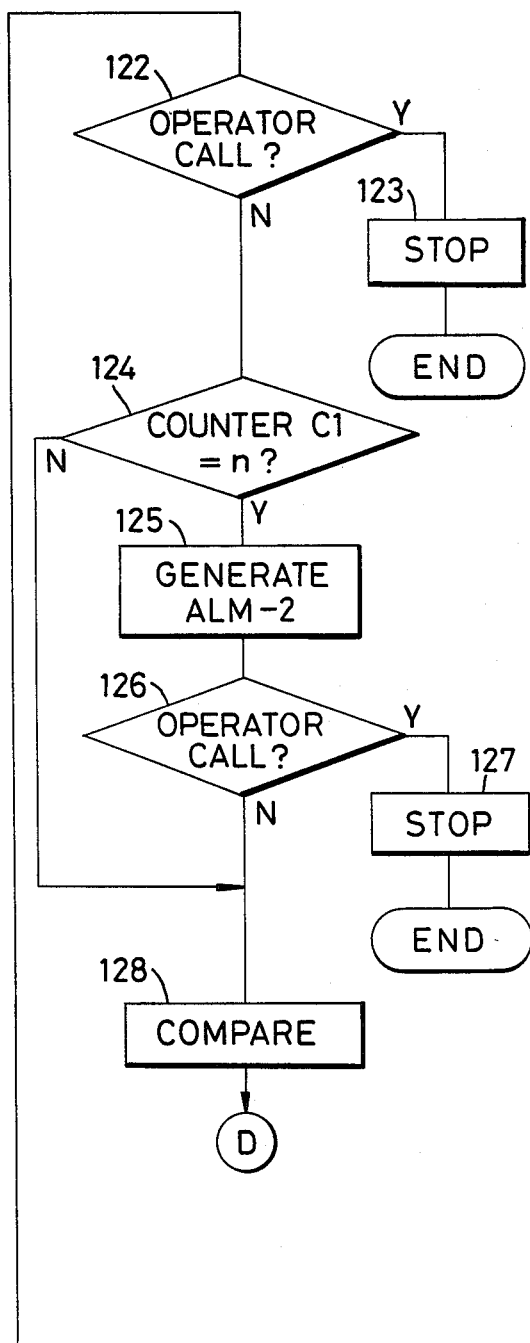
Figure 3B:
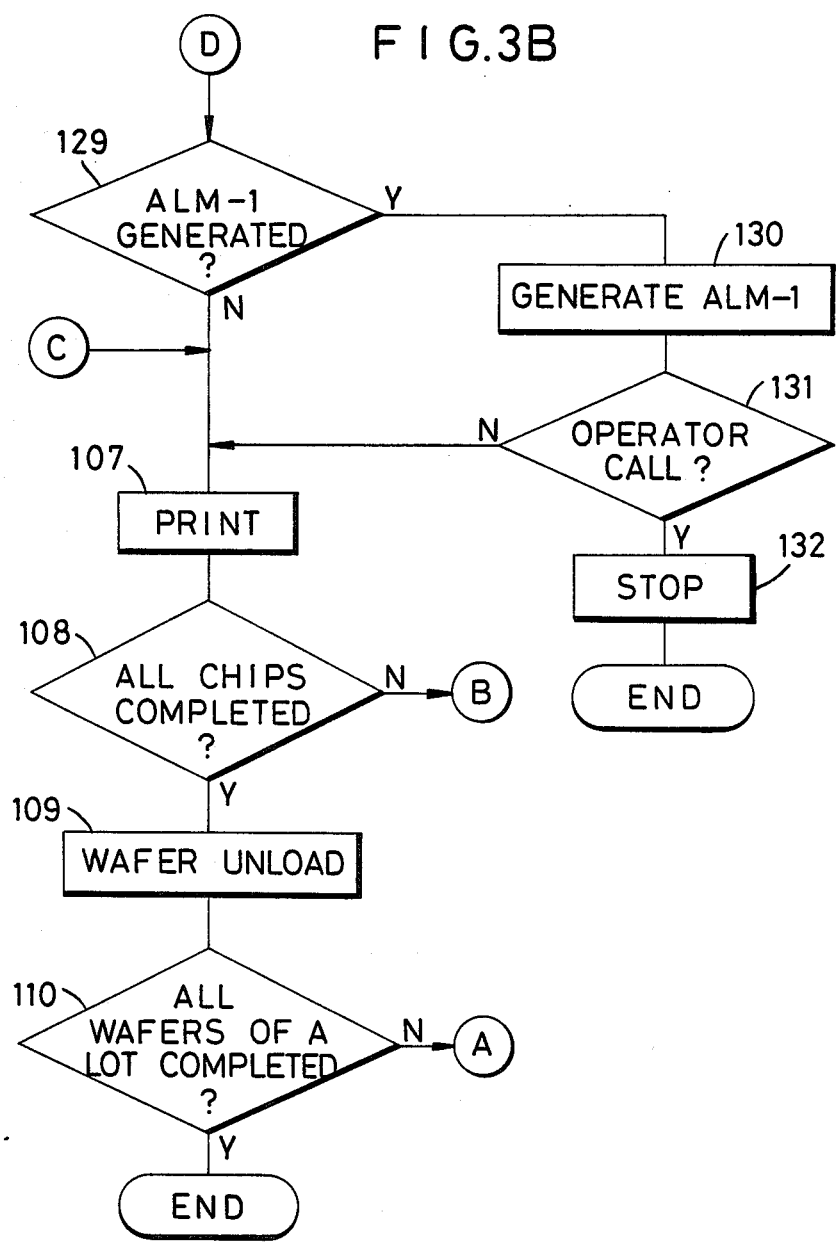

The operation of the apparatus according to this embodiment will now be described with reference to the flow charts shown in FIGS. 3A and 3B. During the operation exemplified in this embodiment, a plurality of wafers are successively processed and, more particularly, a plurality of wafers in a given lot are successively exposed. The operation sequence of this embodiment will be described with reference to respective steps shown in FIGS. 3A and 3B. Note that a "lot" means a group of wafers which are exposed under the same conditions (e.g., the wafers are exposed with an identical reticle).

(Step 100)

After the exposure operation starts, the CPU 20 initializes various parameters necessary for exposure. The typical parameters include, for example, coordinates indicating alignment of a plurality of chips on the predetermined wafer W (to be referred to as shot coordinates hereinafter). In the SR method, the two-dimensional stages are moved based on the shot coordinates. The CPU 20 also initializes parameters for determining an alarm generation mode.

These alarm parameters determine the type and manner of the alarm to be generated for a shot in which the flatness of the exposed region is degraded with respect to the imaging surface of the projection lens 1. In this embodiment, three types of alarms can be produced. A first alarm is generated when the flatness at which exposure is to be performed based on the shot coordinates is degraded. A second alarm is generated when the first alarm is generated n times or more during the exposure operation of a single wafer. A third alarm is generated when the first alarm is generated at the same or adjacent shot coordinate positions on different wafers. The flatness is discriminated with reference to the focal depth of the projection lens 1, and the focal depth is defined in accordance with the resolution required during the exposure operation. The focal depth is also initialized in step 100 in accordance with the required resolution. The parameter-setting operation in this step determines which mode of alarm is to be selected and with which alarm the operation of the apparatus is to be stopped. The parameters can be input from the keyboard 24 at the operator's discretion.

(Step 101)

Next, the CPU 20 generates a wafer-load instruction to pick up a single wafer from the wafer cassette and load it onto the wafer holder 3, and also generates an instruction for executing alignment of the wafer W on the wafer holder 3. This alignment is global alignment of a wafer whose first layer is exposed. Thereby, a chip alignment coordinate system on the wafer W and a moving coordinate system of the stages are defined in one-to-one correspondence.

(Step 102)

Figure 4:
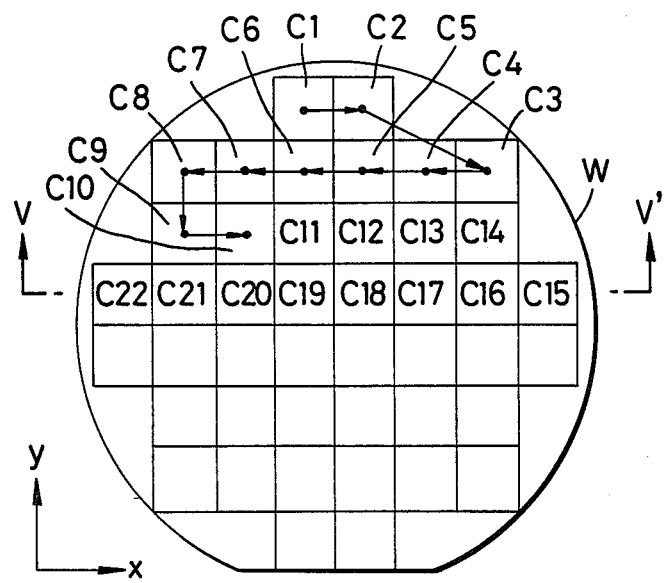
FIG. 4 is a plan view showing chip arrangement on a wafer.

The CPU 20 generates the drive signals DX and DY for shot coordinates based on the position information PX and PY from the interferometers 12 and 13, thereby moving the stages 5 and 6. FIG. 4 is a plan view of chip alignment on the wafer W, wherein rectangular chips C1, C2, C3, . . . , C8, C9, . . . are aligned in a matrix. Note the chip alignment coordinates coincide with the moving coordinates of the stages, i.e., the x-y coordinates. In this embodiment, after the array of the chips C1 and C2 in FIG. 4 is exposed, stepping is performed in the y direction by one line to expose the next array of the chips C3, C4, . . . C8.

(Step 103)

Next, the CPU 20 performs the focusing operation for a chip to be exposed. The CPU 20 causes the driver 7 to be subjected to servo control based on the focal point signal FS from the light receiving device 15, and generates the drive signal DZ suitable for the servo control. Thereby, the z-direction position of the Z stage 4 is adjusted so that the focal plane of the projection lens 1 coincides with the surface of the chip to be exposed. Assuming that the focal point detection system of oblique light incident type disclosed in Japanese Patent Disclosure No. 42205/1981 is used as previously described, the surface level of the chip is detected at substantially the center of the chip i.e., near the optical axis AX of the projection lens 1, and the focal point signal FS is an analog signal corresponding to the deviation of the chip surface from the focal plane in the z direction. When the amount of shift is reduced to zero by adjusting the Z stage 4, the analog value of the focal point signal FS is a predetermined value (e.g., zero) indicating an in-focus state. The CPU 20 detects the predetermined value, and completes the focusing operation.

(Step 104)

Figure 5:
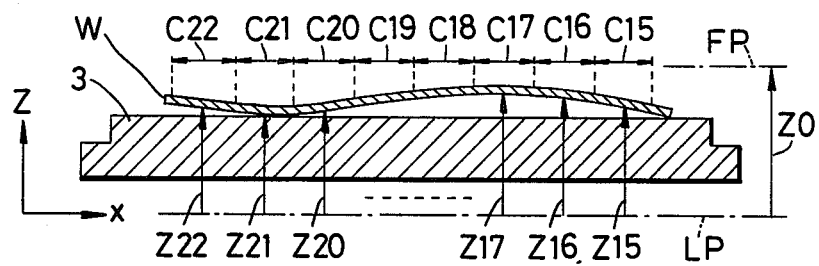
FIG. 5 is a sectional view taken along a line V—V' in FIG. 4 together with a section of a wafer holder.

The CPU 20 respectively reads the position information PX, PY, and PZ from the laser interferometers 12 and 13 and the Z position detector 7a, and stores them. The position information PZ corresponds to the z-direction position of the Z stage 4 when the surface of the chip to be exposed coincides with the focal plane. This state will be explained with reference to FIG. 5. FIG. 5 illustrates a state wherein the position of the wafer W chucked on the wafer holder 3 by suction, cannot be accurately corrected, and the flatness of the wafer W is thus degraded. The Z position detector 7a detects an amount of change along the optical axis AX from a predetermined reference plane LP of the Z stage 4. Assume that, when distances between the reference plane LP and the surface of chips C15 to C22 are measured, these distances are given by Z15, Z16, . . . , Z21, Z22, and a distance between the reference plane LP and a focal plane FP of the projection lens 1 is given by Z0. If focusing is performed for every chip from C15 to C22, adjusting amounts of the level of the Z stage 4, i.e., position information PZ15, PZ16, . . . , PZ21, and PZ22, are detected as Z0-Z15, Z0-Z16, . . . , Z0-Z21, and Z0-Z22. Note that the reference plane LP is virtual, and can coincide with the focal plane FP to provide Z0=0. As will be described in detail later, if the respective position information PZ15, PZ16, . . . , PZ21, and PZ22 includes offset amounts, since they are canceled during calculation of the flatness, there is no problem.

In this embodiment, the position information PX and PY are read from the laser interferometers 12 and 13. However, since the shot coordinates of the chip to be exposed are determined in advance, in practice, the position information to be read need only be information PZ.

(Step 105)

In step 105, the CPU 20 calculates the flatness of the chip to be exposed. A method of calculating the flatness will now be described with reference to FIGS. 6A, 6B, and 7. FIG. 6A illustrates a state wherein the flatness of a single chip falls within an allowable range, and FIG. 6B illustrates a state wherein the flatness falls outside the allowable range. Referring to FIGS. 6A and 6B, the optical axis AX of the projection lens 1 is perpendicular to the focal plane FP, and a focal depth at which a desired resolution can be obtained is given by width d along the optical axis AX. The size of the chip to be exposed is given by CS, and the surface thereof is given by WS, as indicated by a solid line. When focusing is performed, the chip center of the surface WS coincides with the focal plane FP. When the flatness of the surface WS falls within the focal depth d with respect to the entire size CS, as shown in FIG. 6A, the exposure of the chip will not result in poor resolution. However, as shown in FIG. 6B, when the surface WS is so inclined that the surrounding portion of the size CS exceeds the focal depth d, poor resolution occurs in the surrounding portion of the chip. Note that within a small range such as an area defined by the size CS, if the entire wafer is warped as shown in FIG. 5, the surface WS can be regarded as a substantially uniform plane. For this reason, a deviation of the rear end of the chip (shot) from the focal plane FP toward the optical axis AX is given by $\{CS/2\}\cdot\sin\theta$ if an inclination of the surface WS with respect to the focal plane FP is given by $\theta$. Therefore, if $|CS\cdot\sin\theta| \leq d$, a required resolution can be obtained on the overall surface of the chip. On the contrary, if $|CS\cdot\sin\theta| > d$, poor resolution occurs in the surrounding portion of the chip.

FIG. 7 illustrates chip arrangement when the chip C20 is about to be exposed after the exposure operation of the chips C9 to C14, and C15 to C19 has been completed. More specifically, FIG. 7 is an enlarged view of the chips C9 to C11, C19, and C20. The chips C9, C10, C11, and C19 are exposed chips adjacent to the chip C20. The position information PZ9, PZ10, PZ11, and PZ19 respectively associated with the levels of the chips C9, C10, C11, and C19 are detected before they are exposed, and are stored in the RAM 21 connected to the CPU 20. The CPU 20 calculates whether or not four points Pa, Pb, Pc, and Pd surrounding the chip C20 fall within the width of the focal depth d in accordance with the position information PZ20 on the center of the chip C20, and the position information PZ9, PZ10, PZ11, and PZ19 on the centers of the chips C9, C10, C11, and C19. Assuming that the surfaces of adjacent chips can be approximated as continuous displacements, deviation $\Delta Za$, $\Delta Zb$, $\Delta Zc$, and $\Delta Zd$ of the four points Pa, Pb, Pc, and Pd along the optical axis AX with respect to their chip centers can be respectively expressed by:

$$\Delta Za = (|PZ20 - PZ9|)/2 \tag{1}$$

$$\Delta Zb = (PZ20 - PZ10)/2 \quad (2)$$

$$\Delta Zc = (PZ20 - PZ11)/2 \quad (3)$$

$$\Delta Zd = (PZ20 - PZ19)/2 \quad (4)$$

As can be seen from these formulas, since a deviation between the level of the exposed region of interest (chip C20) and the levels of the exposed region therearound is detected, if the detected levels include given offset amounts, they cancel each other out. This means that a deviation can be accurately detected to correspond with a small local inclination of the wafer surface without being influenced by the irregular thickness of the wafer W itself.

The CPU 20 then calculates the equations (1), (2), (3) and (4) and stores the results in the RAM 21. In this case, it is also necessary that the chips which are already exposed, i.e., whose position information PZ is already detected and stored, be searched by the CPU 20, based on the chip alignment data.

(Step 106)

Next, the CPU 20 checks if the calculated deviations $\Delta Za$, $\Delta Zb$, $\Delta Zc$ and $\Delta Zd$ fall within the allowable range in view of the relationship with the focal depth d. Since each deviation amount $\Delta Z$ is an amount of shift of the surrounding portion of the chip with respect to the chip center along the optical axis AX, the deviation at the two ends of the chip is substantially twice the detected amount, and the CPU 20 then performs the following comparisons:

$$\Delta Za \leq d/2 \quad (5)$$

$$\Delta Zb \leq d/2 \quad (6)$$

$$\Delta Zc \leq d/2 \quad (7)$$

$$\Delta Zd \leq d/2 \quad (8)$$

When the inequalities (5) to (8) are satisfied at the same time, any point on the surface of the chip C20 falls within the focal depth d, as shown in FIG. 6A, and therefore, the CPU 20 discriminates that the surface is flat. When the inequalities (5) to (8) are not satisfied, the CPU 20 discriminates that points around the chip C20 fall outside the focal depth d. In the former case, the flow jumps to step 107.

(Step 107)

If the region to be exposed is flat, since an optimal resolution can be obtained, the CPU 20 supplies an instruction to the shutter controlling device 23 to expose and print that region of the wafer W.

(Step 108)

After the exposure operation in step 107, the CPU 20 checks if the exposure operation for all the chips on the single wafer is completed. If the operation is not completed, the operation from step 102 is repeated.

(Step 109)

If it is determined in step 108 that the exposure operation for all the chips is completed, the CPU 20 unloads the exposed wafer W.

(Step 110)

Next, the CPU 20 checks if all the wafers in the lot are exposed. If unexposed wafers remain, the operation from step 101 is repeated.

This time, if it is determined in step 106 that the surface is not flat, the CPU 20 executes steps 120 to 132 (alarm generating means of the present invention) for generating various alarms based on the parameters associated with alarms ALM-1, ALM-2 and ALM-3 set in step 100.

(Step 120)

The CPU 20 generates a first alarm ALM-1 indicating a chip on the wafer to be exposed (e.g., chip C20) has poor flatness. The CPU 20 generates the information associated with the position of the chip on the wafer as the display data VS, and stores the position of the chip which has poor flatness in an internal memory. Thereby, the position of the chip having poor resolution is displayed on the display 25.

(Step 121)

The CPU 20 then increments by one the content of internal counter C1 for counting the number of times the alarm ALM-1 has been generated. Note that the internal counter C1 is cleared to zero when a new wafer is loaded in step 101.

(Step 122)

The CPU 20 checks if the apparatus is to be stopped, interrupting any subsequent exposure operation. When the apparatus is to be stopped, the operator must be notified of this fact. This notification is referred to as an "operator call" hereinafter. The operator call is set in advance by keyboard 24. When the operator call is set to be performed, the flow advances from step 122 to step 123. This is the same for following steps 126 and 131.

(Step 123)

The CPU 20 stops the operation of the apparatus to set it in the standby mode, and supplies the signal ALM corresponding to the alarm ALM-1 to the alarm 26. Thereby, the alarm 26 represents that a chip to be exposed on the wafer will have poor resolution.

(Step 124)

The CPU 20 checks if the number of times the alarm ALM-1 has been generated (counted in step 121), i.e., the number of chips (shots) which have poor resolution, has reached a predetermined number n. Alternatively, it can be checked if a ratio of the number of exposed shots on the single wafer to the number of shots causing the alarm ALM-1 has reached a predetermined value.

(Step 125)

Next, the CPU 20 generates the second alarm ALM-2 indicating that the number of chips having poor flatness on the single wafer exceeds a predetermined number. The CPU 20 generates the display data VS indicating that poor resolution occurs at a plurality of chip positions on the wafer, i.e., that the wafer is so warped that it cannot be sufficiently flattened by the vacuum suction force, and displays the data VS on the display 25.

(Step 126)

The CPU 20 then checks if the operator call is necessary in respective to the alarm ALM-2.

(Step 127)

The CPU 20 stops the operation of the apparatus to set it in the standby mode, and supplies the signal ALM, corresponding to the alarm ALM-2, to the alarm 26. The alarm 26 performs a display which can be distinguished from that of the alarm ALM-1, thus notifying the operator that the possibility of incomplete suction is high.

(Step 128)

The CPU 20 checks if the chip position causing the alarm ALM-1 in step 120 is the same position or near the one that caused the poor-flatness alarm on the previously exposed wafer or wafers.

(Step 129)

If the CPU 20 determines in step 128 that the alarm ALM-1 is generated with respect to the chip at the same position or near it on the previous wafer(s), the flow advances to step 130; otherwise, the CPU 20 executes the operation of step 107.

(Step 130)

When poor resolution occurs at the same position on a plurality of wafers, the CPU 20 generates the third alarm ALM-3 indicating that resist powder or other dust has become chucked to a specific position on the wafer holder. Thus, the display 25 displays that a foreign material has become attached to the wafer holder.

(Step 131)

The CPU 20 checks if the operator call is necessary in response to the alarm ALM-3. When the operator call is not performed, the operation of step 107 is executed.

(Step 132)

The CPU 20 stops the operation of the apparatus to set it in the standby mode, and supplies a signal corresponding to the alarm ALM-3 to the alarm 26. Thus, the display 26 performs a display which can be distinguished from those of the alarms ALM-1 and ALM-2, notifying the operator that the wafer holder needs to be cleaned.

The overall operation of the apparatus of this embodiment has been described. In the sequence shown in FIGS. 3A and 3B, since necessity of generation of various alarms or interruption of the operation is checked during the exposure operation of a single wafer, wafer processing speed may be decreased in a practical application. In addition, since the apparatus may be stopped during the exposure operation of the single wafer, the resulting operation is complicated.

In order to solve this, various alarms can be generated after the exposure operation of the single wafer is completed, e.g., during an unloading operation of the wafer in step 109, and the apparatus can be stopped after unloading. After steps 101 to 104 are executed, steps 107 to 109 can be then executed. More specifically, even if a chip providing poor resolution is found on a wafer, this is ignored, and the exposure operation of the wafer is continued. When the wafer is unloaded in step 109, alarm processing in steps 105 to 132 is executed. In this case, calculation of the flatness in step 105 is repetitively performed for all the chips on the exposed wafer, and step 106 can be omitted. When the flatnesses of the chips is calculated, the chip positions of those with poor flatness are displayed on the display 25 in step 120, and the number of chips is counted in step 121. When the number of chips is zero, alarming is unnecessary, and the operation is repeated from step 110, as described above. However, if the number of chips is not zero in step 121 steps 124, 125, 128, 129 and 130 are sequentially executed. In this case, steps 122, 123, 126, 127 and 131 are unnecessary. After step 129 or 130 is completed, various alarm states are displayed by the alarm 26. When the alarm display is made, the apparatus is automatically set in the standby mode after the wafer unloading operation in step 109 is completed, and assistance by the operator (e.g., instruction input from the keyboard 24) is awaited. With this arrangement, since checking of a wafer causing poor resolution can be realized while maintaining a high throughput, the apparatus of the present invention is very effective in a semiconductor-element production line.

In the above embodiment, since the chip positions of chips on the wafer causing poor resolution are sequentially stored in step 120, if the storage content is transferred to another fixed storage device (e.g., magnetic disks, floppy disks, magnetic cards, tapes, or the like), they can be utilized as management data for later wafer processing. For example, when chips are tested using a wafer prober and a tester, and the chips causing poor resolution are found to be defective in advance, the test of these chips can be automatically omitted. In contrast to this, test priority can be given to such chips causing poor resolution. In addition, if poor resolution data is supplied to a defect correction apparatus using a laser spot, it can be used together with a prober when defects are to be corrected.

When the flatness for each chip is calculated after the exposure operation of a single wafer is completed, position information PZ on a maximum of 8 chips in the chips surrounding an exposed region of interest can be compared with that of the exposed region of interest. When various alarms are produced during the exposure operation, initially exposed chips on a wafer often have a small number of or no information PZ on surrounding chips to be compared with. In this case, the flatness of the initially exposed chips is re-calculated during the exposure operation or after the exposure operation of the wafer is completed.

Since the flatness is detected by obtaining position information for several points around an exposed region of interest, as shown in FIG. 7, it can be detected which portion of the exposed region causes poor resolution. More specifically, a portion which does not satisfy the previous inequalities (5) to (8) is detected, and the detection result is generated as the data VS to be displayed on the display 25.

The above embodiment of the present invention has been exemplified using a reduction/projection type exposure apparatus, but can be similarly applied to an X-ray stepper. In this case, a gap between a mask and a wafer is set to be 10 to 50 micrometers. Although the X-ray stepper has no focusing optical system, an original image can be assumed to be formed at a position separated from the mask by the gap. The flatness of a wafer surface is discriminated to determine whether or not the deviation of the chip surface of the wafer from the image surface of the original image falls within an allowable range which can provide desired resolution when the wafer is exposed.

When the level of each exposed region on a wafer is measured, the wafer is two-dimensionally moved while fixing the Z stage 4 at a given level, and an analog change in the focal point signal FS at that time can be detected. With this arrangement, chips causing poor resolution can be detected before the exposure operation. In a method wherein an objective lens is vertically moved to always be focused on the surface of a wafer, vertical displacement of the objective lens is read for each exposed region, thus enabling calculation of the flatness. When the Z stage 4 or the objective lens is vertically driven by a pulse motor, if a counter for counting the number of pulses supplied to the pulse motor is provided to the CPU 20, this counter can serve as the Z position detector 7a.

According to the present invention as described above, since determination of poor resolution can be made before the exposure operation, unnecessary exposure operations can be avoided.

I claim:

1. An apparatus for forming a pattern of a mask on each of a plurality of regions on a surface of a substrate, comprising:
   (a) stage means for disposing a substrate thereon so that a surface of said substrate is substantially perpendicular to a predetermined axis;
   (b) holding means for holding a mask so that a surface of said mask is substantially perpendicular to said predetermine axis;
   (c) exposing means for emitting radiation toward said mask held by said holding means to expose the pattern of said mask on said surface of said substrate disposed on said stage means, said exposing means having a projection optical system disposed between said stage means and said holding means, said projection optical system forming an image of said mask held by said holding means on said surface of said substrate disposed on said stage means, an optical axis of said projection optical system corresponding to said predetermined axis;
   (d) displacing means for providing a displacement between said stage means and said holding means in a direction which is substantially perpendicular to said predetermined axis;
   (e) control means for controlling said exposing means and said displacing means so that an exposing operation of said exposing means and a displacing operation of said displacing means are performed repeatedly, and so that areas of a plurality of regions on said surface of said substrate are exposed to the pattern of said mask successively;
   (f) detecting means for detecting distances along said predetermined axis between a reference position and respective exposed areas of said surface of said substrate and for generating detection signals conforming to the detected distances, respectively, said detecting means detecting the distance between said reference position and a predetermined position of each of said plurality of regions on said surface of said substrate, said predetermined position substantially corresponding to a center of each of said plurality of regions; and
   (g) alarm means for calculating a difference between the distances conforming to a detection signal and a succeeding detection signal, for determining whether the calculated difference exceeds a predetermined range, and for generating an alarm signal if the calculated difference exceeds said predetermined range, said predetermined range being determined on the basis of focal depth of said projection optical system.

2. An apparatus according to claim 1, which further comprises means for displaying generation of said alarm signal.

3. An apparatus according to claim 1, which further comprises means for counting a number of generations of said alarm signal and generating another alarm signal if the counted number of generations of said alarm signal is equal to a predetermined number.

4. An apparatus according to claim 3, which further comprises means for detecting that all of a plurality of regions of one substrate disposed on said stage means have been exposed be the pattern of said mask and generating another detection signal; means responsive to said another detection signal for disposing another substrate on said stage means instead of said one substrate; and means for detecting whether an alarm signal is generated for corresponding positions of said one substrate and said another substrate, and, if so, generating a further alarm signal.

5. An apparatus having a stage capable of moving in two-dimensional directions parallel to a reference plane and holding thereon a substrate having a plurality of regions on each of which an original image is exposed, comprising:
   (a) means for measuring a distance between said reference plane and each of said plurality of regions in a direction which is substantially perpendicular to said reference plane and producing corresponding measuring signals indicative of the measured distances; and
   (b) alarm means for detecting a difference between the measured distance of one of said plurality of regions and the measured distance of at least another of said plurality of regions adjacent to said one region on the basis of the corresponding measuring signals and for generating an alarm signal when said difference exceeds a predetermined range.

6. An apparatus according to claim 5, which further comprises means for displaying generation of said alarm signal.

7. An apparatus according to claim 5, which further comprises means for counting a number of generations of said alarm signal, detecting that the counted number of generations of said alarm signal is equal to a predetermined number and generating another alarm signal.

8. An apparatus according to claim 7, which further comprises means for detecting that all of a plurality of regions of one substrate disposed on said stage have been exposed by said original image and generating another detection signal; means responsive to said another detection signal for disposing another substrate on said stage instead of said one substrate; and means for detecting whether an alarm signal is generated for corresponding positions on said one substrate and said another substrate, and, if so, generating a further alarm signal.

9. An apparatus for forming a pattern of a mask on each of a plurality of regions on a surface of a substrate, comprising:
   (a) stage means for disposing a substrate thereon so that a surface of said substrate is substantially perpendicular to a predetermined axis;

(b) holding means for holding a mask so that a surface of said mask is substantially perpendicular to said predetermined axis;
(c) exposing means for emitting radiation toward said mask held by said holding means to expose the pattern of said mask on said surface of said substrate disposed on said stage means;
(d) displacing means for providing a displacement between said stage means and said holding means in a direction which is substantially perpendicular to said predetermined axis;
(e) control means for controlling said exposing means and said displacing means so that an exposing operation of said exposing means and a displacing operation of said displacing means are performed repeatedly, and so that areas of a plurality of regions on said surface of said substrate are exposed to the pattern of said mask successively;
(f) detecting means for detecting distances along said predetermined axis between a reference position and respective exposed areas of said surface of said substrate and for generating detection signals conforming to the detected distances, respectively; and
(g) alarm means for calculating a difference between the distances conforming to a detection signal and a succeeding detection signal, for determining whether the calculated difference exceeds a predetermined range, and for generating an alarm signal if the calculated difference exceeds said predetermined range, whereby said alarm signal is generated when the difference between the detected distances for two adjacent regions on said surface of said substrate exceeds said predetermined range.

* * * * *